United States Patent
Kim et al.

(10) Patent No.: US 11,349,392 B2
(45) Date of Patent: May 31, 2022

(54) POWER VOLTAGE GENERATOR AND DISPLAY DEVICE HAVING THE SAME

(71) Applicant: Samsung Display Co., Ltd., Yongin-Si (KR)

(72) Inventors: Kyun Ho Kim, Yongin-si (KR); Jung-taek Kim, Seoul (KR); Joon Suk Baik, Suwon-si (KR); Sang Su Han, Hwaseong-si (KR); Jae Woo Ryu, Suwon-si (KR); Myung Ho Lee, Anyang-si (KR)

(73) Assignee: Samsung Display Co., Ltd.

( * ) Notice: Subject to any disclaimer, the term of this patent is extended or adjusted under 35 U.S.C. 154(b) by 107 days.

(21) Appl. No.: 16/871,157

(22) Filed: May 11, 2020

(65) Prior Publication Data
US 2021/0099083 A1 Apr. 1, 2021

(30) Foreign Application Priority Data

Sep. 30, 2019 (KR) .......................... 10-2019-0120953

(51) Int. Cl.
*H02M 3/156* (2006.01)
*H03F 3/14* (2006.01)

(52) U.S. Cl.
CPC .............. *H02M 3/156* (2013.01); *H03F 3/14* (2013.01)

(58) Field of Classification Search
None
See application file for complete search history.

(56) References Cited

U.S. PATENT DOCUMENTS

| 7,696,731 | B2* | 4/2010 | Huang | ................ H02M 3/1588 323/222 |
| 8,299,770 | B2* | 10/2012 | Qiu | ..................... H02M 3/1588 323/282 |
| 8,767,424 | B2* | 7/2014 | Kazama | ............. H03K 17/0822 363/131 |
| 9,123,286 | B2* | 9/2015 | Park | ......................... G09G 3/32 |
| 2005/0270813 | A1* | 12/2005 | Zhang | .................... H02M 3/157 363/89 |
| 2012/0049825 | A1 | 3/2012 | Chen et al. | |
| 2017/0033692 | A1* | 2/2017 | Kim | .................... H02M 3/1588 |

FOREIGN PATENT DOCUMENTS

| EP | 3125416 A1 | 2/2017 |
| KR | 10-1164245 B1 | 7/2012 |
| KR | 10-1950844 B1 | 2/2019 |

* cited by examiner

*Primary Examiner* — Jeffrey A Gblende
(74) *Attorney, Agent, or Firm* — Innovation Counsel LLP

(57) ABSTRACT

A power voltage generator includes a booster, a voltage sensor, a constant voltage controller and a constant current controller. The booster is configured to boost an input voltage to an output voltage based on an on-off operation of a switch. The voltage sensor is configured to generate a sensing voltage by sensing the output voltage. The constant voltage controller is configured to generate a first switching signal to control the switch by comparing the sensing voltage with a reference voltage. The constant current controller is configured to generate a gain based on a ratio of an electrode signal of the switch and a target signal by comparing the electrode signal of the switch with the target signal.

26 Claims, 8 Drawing Sheets

FIG. 3

| LOAD | NPC | GCM | TARGET DUTY |
|---|---|---|---|
| 1% | 1% | 1A | 10% |
| 10% | 10% | 10A | 30% |
| 30% | 30% | 30A | 50% |
| 40% | 30% | 30A | 50% |
| 60% | 30% | 30A | 50% |
| 80% | 30% | 30A | 50% |

POWER VOLTAGE GENERATOR AND DISPLAY DEVICE HAVING THE SAME

CROSS-REFERENCE TO RELATED APPLICATION

This application claims priority under 35 USC § 119 to Korean Patent Application No. 10-2019-0120953, filed on Sep. 30, 2019 in the Korean Intellectual Property Office (KIPO), the entire disclosure of which is incorporated herein by reference.

BACKGROUND

1. Field

Exemplary embodiments of the present inventive concept relate to a power voltage generator and a display device including the power voltage generator. More particularly, exemplary embodiments of the present inventive concept relate to a power voltage generator reducing a manufacturing cost and a power consumption and a display device including the power voltage generator.

2. Description of the Related Art

Generally, a display device includes a display panel and a display panel driver. The display panel includes a plurality of gate lines, a plurality of data lines and a plurality of pixels. The display panel driver includes a gate driver outputting a gate signal to the plurality of gate lines, a data driver outputting a data voltage to the plurality of data lines and a power voltage generator providing a power voltage to the pixels.

Constant voltage control and constant current control may be performed with respect to the power voltage provided to the pixels. The constant current control module may be configured to lower an input voltage of the power voltage generator when the measured current has a value higher than a predetermined current.

In order to measure the current in the constant current control module, it is necessary to provide a large sensing resistor and an IC that detects the current caused by a voltage applied across the large sensing resistor and converts the current into a digital code.

In addition, since a large voltage is applied to the sensing resistor, problems such as heat generation, voltage drop of the power voltage, and an increase of power consumption may occur.

SUMMARY

Exemplary embodiments of the present inventive concept provide a power voltage generator sensing a signal at an electrode of a switch of a booster to operate constant current control.

Exemplary embodiments of the present inventive concept also provide a display device including the power voltage generator.

In an exemplary embodiment of a power voltage generator according to the present inventive concept, the power voltage generator includes a booster, a voltage sensor, a constant voltage controller and a constant current controller. The booster is configured to boost an input voltage to an output voltage based on an on-off operation of a switch. The voltage sensor is configured to generate a sensing voltage by sensing the output voltage. The constant voltage controller is configured to generate a first switching signal to control the switch by comparing the sensing voltage with a reference voltage. The constant current controller is configured to generate a gain based on a ratio of an electrode signal of the switch and a target signal by comparing the electrode signal of the switch with the target signal.

In an exemplary embodiment, the power voltage generator may further include a gain operator configured to generate a second switching signal by multiplying the gain to the first switching signal. The on-off operation of the switch may be controlled by the second switching signal.

In an exemplary embodiment, the booster may include an inductor, a first diode, and the switch. The inductor may include a first terminal to which the input voltage is applied and a second terminal connected to a first electrode of the first diode. The switch may include a gate electrode, a source electrode and a drain electrode, the second switching signal is applied to the gate electrode, and the drain electrode is connected to the first electrode of the first diode. The first diode may include the first electrode connected to the second terminal of the inductor and a second electrode connected to the voltage sensor and outputting the output voltage to the voltage sensor.

In an exemplary embodiment, the electrode signal of the switch may be a first signal which is a signal of the gate electrode of the switch.

In an exemplary embodiment, the first signal may be a pulse width modulation signal. The power voltage generator may further include a signal smoothing circuit configured to convert the first signal, which is the pulse width modulation signal, into a second signal, which is a direct current signal.

In an exemplary embodiment, the signal smoothing circuit may include a second diode, a resistor, and a capacitor. The second diode may include a first electrode to which the first signal is applied and a second electrode connected to a first terminal of the resistor. The resistor may include a first terminal connected to the second electrode of the second diode and a second terminal connected to a ground. The capacitor may include a first electrode connected to the second electrode of the second diode and a second electrode connected to the ground.

In an exemplary embodiment, the constant current controller may be configured to generate the gain by comparing the second signal with a target duty ratio signal for generating a target current determined based on a load of input image data of a display device. The target current may increase as the load of the input image data increases and may maintain a saturation current after the target current reaches the saturation current.

In an exemplary embodiment, the constant current controller may include a second operator including a first input electrode to which the target duty ratio signal is input, a second input electrode to which the second signal is applied, and an output electrode connected to the gain operator and to outputting the gain to the gain operator.

In an exemplary embodiment, the constant current controller may be configured to shut down the power voltage generator when a difference between the target duty ratio signal and the second signal is greater than or equal to a threshold.

In an exemplary embodiment, the second operator may be configured to output the gain of zero (0) when the difference between the target duty ratio signal and the second signal is greater than or equal to the threshold.

In an exemplary embodiment, when the input voltage of the booster is VI, the output voltage of the booster is VO, an output current of the booster is IO, a measured duty ratio of the switch is D, an inductance of the inductor is L, and a time is t, the IO may be represented as follows:

$$IO = \frac{VI^2 D^2 t}{2L(VO - VI)} \ldots$$

In an exemplary embodiment, the electrode signal of the switch is a first signal which is a signal of the source electrode of the switch.

In an exemplary embodiment, the first signal is a triangular wave signal. The power voltage generator may further include a signal smoothing circuit configured to convert the first signal, which is the triangle wave signal, into a second signal, which is a direct current signal.

In an exemplary embodiment, the signal smoothing circuit may include a second diode, a resistor, and a capacitor. The second diode may include a first electrode to which the first signal is applied and a second electrode connected to a first terminal of the resistor. The resistor may include the first terminal connected to the second electrode of the second diode and a second terminal connected to a ground. The capacitor may include a first electrode connected to the second electrode of the second diode and a second electrode connected to a ground.

In an exemplary embodiment, the constant current controller may be configured to generate the gain by comparing the second signal with a net power control signal determined by a load of an input image data of a display device. The net power control signal may increase as the load of the input image data increases and maintain a saturation level after the net power control signal reaches the saturation level.

In an exemplary embodiment, the constant current controller may include a second operator including a first input electrode to which the net power control signal is input, a second input electrode to which the second signal is applied, and an output electrode connected to the gain operator and outputting the gain to the gain operator.

In an exemplary embodiment, the constant current controller may be configured to shut down the power voltage generator when a difference between the net power control signal and the second signal is greater than or equal to a threshold.

In an exemplary embodiment, the second operator may output the gain of zero (0) when the difference between the net power control signal and the second signal is greater than or equal to the threshold.

In an exemplary embodiment, the voltage sensor may include a first sensing resistor and a second sensing resistor. The first sensing resistor may include a first terminal connected to the second electrode of the first diode and a second terminal connected to a first terminal of the second sensing resistor. The second sensing resistor may include a first terminal connected to the second terminal of the first sensing resistor and a second terminal connected to a ground.

In an exemplary embodiment, the constant voltage controller may include a first operator including a first input electrode to which the sensing voltage is applied, a second input electrode to which the reference voltage is applied, and an output electrode connected to the gain operator and outputting to output the first switching signal to the gain operator.

In an exemplary embodiment of a display device according to the present inventive concept, the display device includes a display panel, a gate driver, a data driver and a power voltage generator. The display panel includes a gate line, a data line, and a pixel connected to the gate line and the data line. The display panel configured to display an image based on input image data. The gate driver is configured to output a gate signal to the gate line. The data driver is configured to output a data voltage to the data line. The power voltage generator is configured to apply a power voltage to the pixel. The power voltage generator includes a booster configured to boost an input voltage to an output voltage based on an on-off operation of a switch, a voltage sensor configured to generate a sensing voltage by sensing the output voltage, a constant voltage controller configured to generate a first switching signal to control the switch by comparing the sensing voltage with a reference voltage and a constant current controller connected to the switch to receive an electrode signal from the switch and configured to generate a gain based on a ratio of the electrode signal of the switch and a target signal by comparing the electrode signal of the switch with the target signal. The output voltage is the power voltage.

In an exemplary embodiment, the power voltage generator may further include a gain operator connected to the constant voltage controller to receive an output from the constant voltage controller and the constant current controller to receive the gain from the constant current controller, and configured to generate a second switching signal by multiplying the gain to the first switching signal. The on-off operation of the switch may be controlled by the second switching signal.

In an exemplary embodiment of a power voltage generator according to the present inventive concept, the power voltage generator includes a booster connected between an input voltage node and an output voltage node, the booster including a switch which includes a source electrode connected to a ground and a gate electrode, a voltage sensor connected to an output node and outputting a sensing voltage, a first OP AMP which includes a first input electrode receiving the sensing voltage and a second input electrode receiving a reference voltage to output a first switching signal, a second OP AMP which includes a first input electrode receiving a target duty ratio signal and a second input electrode connected to the switch, and a gain operator connected between the switch and the constant voltage controller, and the switch and the constant current controller, the gain operator receiving the first switching signal and the gain from the constant voltage controller and the constant current controller, respectively.

The power voltage generator may further include a signal smoothing circuit connected between the second electrode of the constant current controller and the switch.

The second electrode of the constant current controller may be connected to the gate electrode of the switch via a diode in the signal smoothing circuit.

The second electrode of the constant current controller may be connected to the source electrode of the switch via a diode in the signal smoothing circuit.

According to the above-described power voltage generator and the display device including the power voltage generator, the constant current control may be operated by sensing the signal of the gate electrode or the signal of the source electrode of the switch of the booster, so that the large sensing resistor for current sensing and the IC that detects the current caused by the voltage applied across the large sensing resistor and converts the current into a digital code may be omitted. Therefore, the manufacturing cost of the display device may be reduced.

In addition, heat generation, voltage drop of the power voltage, and an increase of power consumption, which may occur when a large voltage is applied to the sensing resistor, may be prevented.

BRIEF DESCRIPTION OF THE DRAWINGS

The above and other features and advantages of the present inventive concept will become more apparent by describing in detailed exemplary embodiments thereof with reference to the accompanying drawings, in which:

FIG. 3 is a table illustrating a target duty ratio signal of FIG. 2;

FIG. 5A is an equivalent circuit diagram of a booster shown in FIG. 2 when a switch of FIG. 2 is turned on;

DETAILED DESCRIPTION OF THE EMBODIMENTS

Hereinafter, the present inventive concept will be explained in detail with reference to the accompanying drawings.

Figure 1:
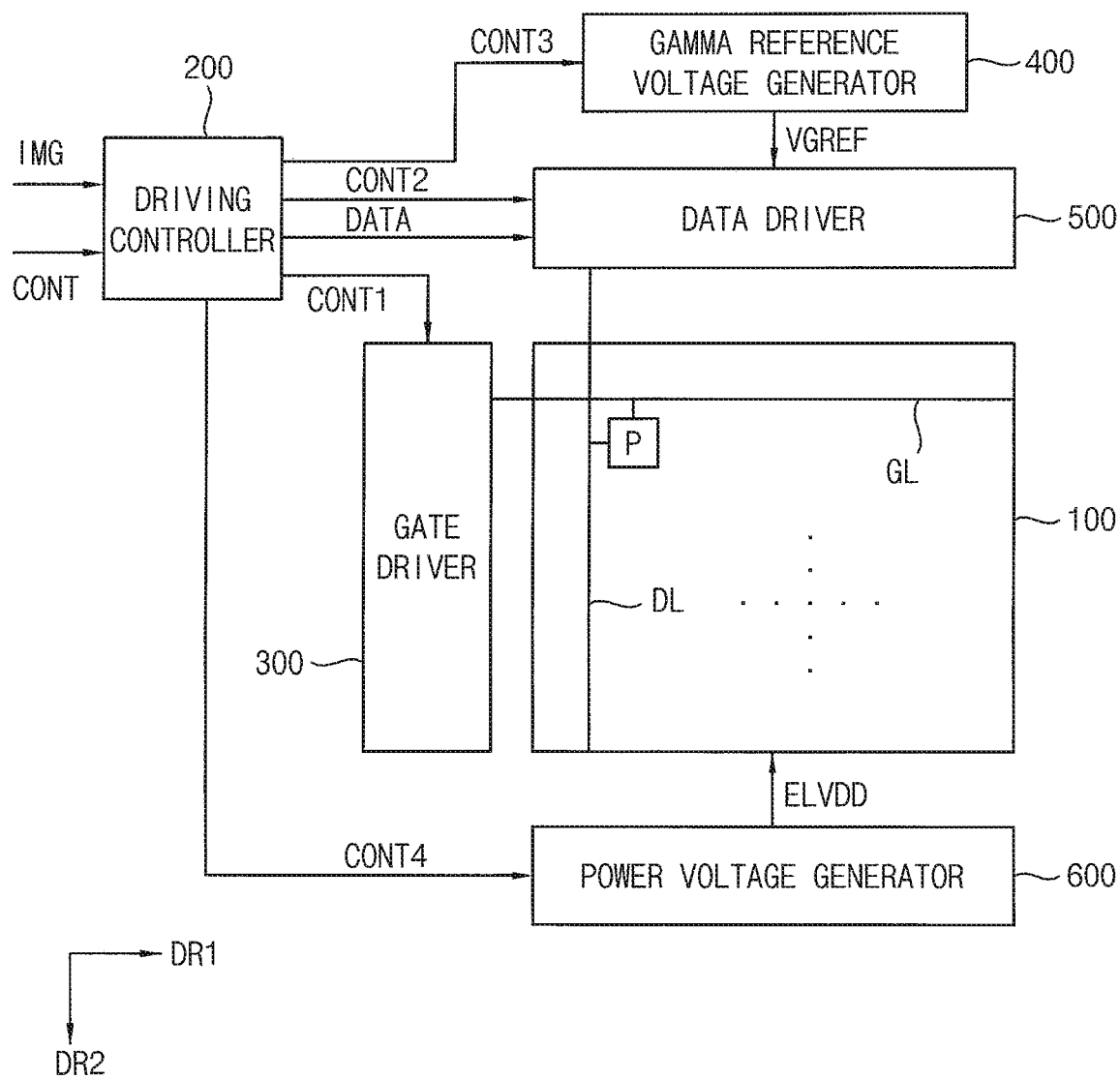
FIG. 1 is a block diagram illustrating a display device according to an exemplary embodiment of the present disclosure.

FIG. 1 is a block diagram illustrating a display device according to an exemplary embodiment of the present disclosure.

Referring to FIG. 1, the display device includes a display panel 100 and a display panel driver. The display panel driver includes a driving controller 200, a gate driver 300, a gamma reference voltage generator 400, a data driver 500 and a power voltage generator 600.

For example, the driving controller 200 and the data driver 500 may be integrally formed in one IC. For example, the driving controller 200, the gamma reference voltage generator 400 and the data driver 500 may be integrally formed in one IC. For example, the driving controller 200, the gate driver 300, the gamma reference voltage generator 400 and the data driver 500 may be integrally formed in one IC.

The display panel 100 includes a display region and a peripheral region adjacent to the display region and surrounding the display region.

For example, the display panel 100 may be an organic light emitting diode display panel including an organic light emitting diode.

The display panel 100 includes a plurality of gate lines GL, a plurality of data lines DL and a plurality of pixels electrically connected to the gate lines GL and the data lines DL. The gate lines GL extend in a first direction DR1 and the data lines DL extend in a second direction DR2 crossing the first direction DR1.

The driving controller 200 receives input image data IMG and an input control signal CONT from an external apparatus, for example, a graphic controller. The input image data IMG may include red image data, green image data and blue image data. The input image data IMG may further include white image data. The input image data IMG may further include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the power voltage generator 600 based on the input image data IMG or the input control signal CONT, and outputs the fourth control signal CONT4 to the power voltage generator 600.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the display panel 100. For example, the gate driver 300 may be integrated on the display panel 100.

For example, the gate lines GL may include a writing gate line to transmit a writing gate signal to the pixel. In addition, the gate lines GL may include an initializing gate line to transmit an initializing gate signal to the pixel.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an exemplary embodiment, the gamma reference voltage generator 400 may be integrated in the driving controller 200, or integrated in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF provided from the gamma reference voltage generator 400. The data driver 500 outputs the data voltages to the data lines DL.

The power voltage generator 600 may generate a power voltage to drive the display device. For example, the power voltage generator 600 may generate a power voltage to drive an organic light emitting diode in the display panel 100. For example, the power voltage generator 600 may generate a high power voltage ELVDD to drive the organic light emitting diode in the display panel 100.

For example, the power voltage generator 600 may further generate a low power voltage to drive the organic light emitting diode in the display panel 100. For example, the power voltage generator 600 may further generate a gate power voltage to drive the gate driver 300. For example, the power voltage generator 600 may further generate a data power voltage to drive the data driver 500. For example, the power voltage generator 600 may further generate a common voltage applied to the display panel 100.

Figure 2:
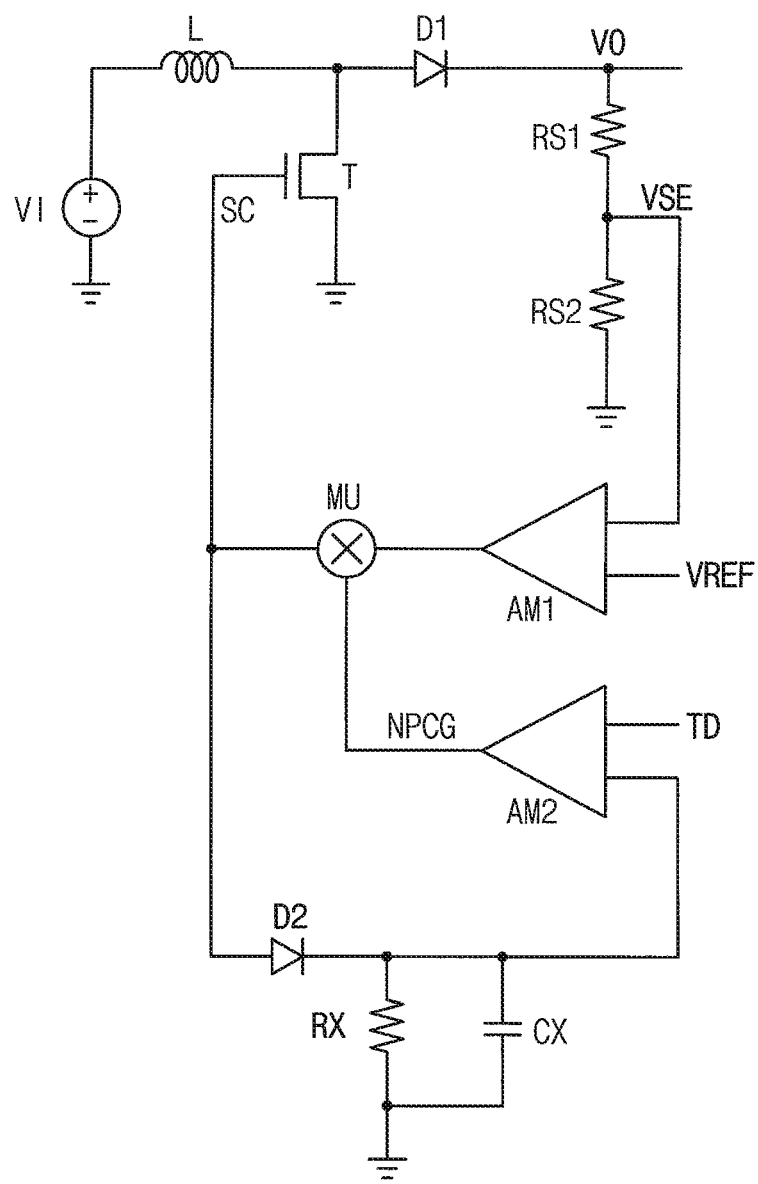
FIG. 2 is a circuit diagram illustrating a power voltage generator of FIG. 1.

FIG. 2 is a circuit diagram illustrating a power voltage generator 600 of FIG. 1. FIG. 3 is a table illustrating a target duty ratio signal TD of FIG. 2.

Referring to FIGS. 1 to 3, the power voltage generator 600 may include a booster, a voltage sensor, a constant voltage controller, and a constant current controller.

The booster may boost an input voltage VI to an output voltage VO based on the on-off operation of a switch T. The voltage sensor may generate a sensing voltage VSE by sensing the output voltage VO. The constant voltage controller may generate a first switching signal for controlling the switch T by comparing the sensing voltage VSE with a reference voltage VREF. The constant current controller may generate a gain NPCG based on a ratio of an electrode signal of the switch T and a target signal by comparing the electrode signal of the switch T with the target signal. In the present embodiment, the target signal may be a target duty ratio signal TD for generating a target current which is determined based on a load of input image data IMG of a display device. In the present embodiment, the electrode signal may be a signal of a gate electrode of the switch T.

The power voltage generator 600 may further include a gain operator MU configured to generate a second switching signal SC by multiplying the gain NPCG to the first switching signal which is an output from the constant voltage controller. The on-off operation of the switch T may be controlled by the second switching signal SC.

The booster may include an inductor L, a first diode D1, and the switch T. The inductor L may include a first terminal to which the input voltage VI is applied and a second terminal connected to a first electrode of the first diode D1. The switch T may include a gate electrode, a source electrode, and a drain electrode. The second switching signal SC may be applied to the gate electrode of the switch T, and the drain electrode of the switch T may be connected to the first electrode of the first diode D1. The source electrode of the switch T may be connected to a ground. The first diode D1 may include the first electrode connected to the second terminal of the inductor L and a second electrode connected to the voltage sensor to output the output voltage.

The voltage sensor may include a first sensing resistor RS1 and a second sensing resistor RS2 which are connected in series. The first sensing resistor RS1 may include a first terminal connected to the second electrode of the first diode D1 to receive the output voltage from the booster and a second terminal connected to a first terminal of the second sensing resistor RS2. The second sensing resistor RS2 may include a first terminal connected to the second terminal of the first sensing resistor RS1 and a second terminal connected to the ground. The voltage sensor may sense a voltage between the first sensing resistor RS1 and the second sensing resistor RS2 which is the sensing voltage VSE corresponding to the output voltage VO according to the voltage divider rule between the first sensing resistor RS1 and the second sensing resistor RS2.

The constant voltage controller may include a first operator (e.g. OP AMP) AM1 including a first input electrode to which the sensing voltage VSE is applied, a second input electrode to which the reference voltage VREF is applied, and an output electrode to output the first switching signal.

The power voltage generator 600 may further include a signal smoothing circuit. In the present embodiment, the electrode signal applied to the gate electrode of the switch T may be a first signal which is a signal applied to the gate electrode of the switch. The first signal may be a pulse width modulation signal. The first signal may be the second switching signal SC which is an output signal from the gain controller MU.

The signal smoothing circuit may convert the first signal, which is the pulse width modulation signal, into a second signal, which is a direct current signal. For example, the signal smoothing circuit may include a low pass filter.

The signal smoothing circuit may include a second diode D2, a resistor RX, and a capacitor CX. The second diode D2 may include a first electrode to which the first signal is applied and a second electrode connected to a first terminal of the resistor RX. The resistor RX may include the first terminal connected to the second electrode of the second diode D2 and a second terminal connected to the ground. The capacitor CX may include a first electrode connected to the second electrode of the second diode D2 and a second electrode connected to the ground.

The constant current controller may generate the gain NPCG by comparing the second signal with a target duty ratio signal TD for generating a target current GCM, which is determined based on the load of the input image data IMG of the display device.

The display device may have a net power control function for estimating power consumption of the display device based on the input image data IMG. For example, the net power control function may be operated by a driving controller 200. For example, when the input image data IMG is configured to turn on an area of 1% of the display panel 100 to a set maximum luminance (e.g. 500 nits), the load of the input image data IMG may be set to 1%. In addition, when the input image data IMG is configured to turn on an area of 10% of the display panel 100 to the maximum luminance (e.g. 500 nits), the load of the input image data IMG may be set to 10%. However, due to the limitation of maximum current, the input image data IMG cannot turn on an area of 100% of the display panel 100 to the maximum luminance (e.g. 500 nits. When the load of the input image data IMG is greater than a predetermined value, the maximum luminance may be reset to the level lower than 500 nits to control the maximum current of the display to be lower than a predetermined value. This operation is called the net power control function. In case when the maximum current of the display is set as the current obtained when the input image data IMG turns on an area of 30% of the display panel 100 to the maximum luminance (e.g. 500 nits), if the input image data IMG required to turn on an area of 60% of the display panel 100 to the maximum luminance is input, the maximum luminance may be reduced from 500 nits to 250 nits to display the image to maintain the maximum current of the display within the set maximum value.

As shown in FIG. 3, the load LOAD of the input image data IMG may be the same as the net power control value NPC when the load LOAD of the input image data IMG has a value lower than the saturation level (e.g. 30%) of the net power control. In contrast, when the load LOAD of the input image data IMG has a value greater than the saturation level (e.g. 30%) of the net power control, the net power control value NPC no longer increases even when the load LOAD of the input image data IMG increases greater than the saturation level (e.g. 30%) and the saturation level (e.g. 30%) of the net power control is maintained.

In addition, the target current GCM is a current for implementing the net power control value NPC, the target current GCM may have a value proportional to the net power control value NPC. For convenience of explanation, when the target current GCM for implementing the net power control value NPC of 1% is 1 A, the target current GCM for implementing the net power control value NPC of 10% may be 10 A and the target current GCM for implementing the net power control value NPC of 30% may be 30 A.

Similar to the net power control value NPC, the target current GCM may increase proportional to the load LOAD of the input image data IMG until it reaches the saturation current which is, for example, 30 A. When the load LOAD of the input image data IMG increases greater than the saturation level, for example, 30%, the target current GCM may be maintained as the saturation current (e.g. 30 A).

The target duty ratio TARGET DUTY refers to a duty ratio of the switch T of the power voltage generator 600 for implementing the net power control value NPC. Therefore, the target duty ratio TARGET DUTY may also have a value generally proportional to the net power control value NPC. For example, the target duty ratio TARGET DUTY for implementing the net power control value NPC of 1% may be 10%, the target duty ratio TARGET DUTY for implementing the net power control value NPC of 10% may be 30%, and the target duty ratio TARGET DUTY for implementing the net power control value NPC of 30% may be 50%.

The numerical values shown in FIG. 3 are for the sake of convenience of explanation, and the present disclosure is not limited to the numerical values shown in FIG. 3.

The driving controller 200 may output at least one information of the net power control value NPC, the target current GCM, and the target duty ratio TARGET DUTY to the power voltage generator 600.

According to the present embodiment, the constant current controller may generate the gain NPCG by comparing the second signal with the target duty ratio signal TD for generating the target current GCM determined based on the load of the input image data IMG of the display device. As described above, the target current GCM may increase as the load of the input image data IMG increases, and the saturation current may be maintained after the target current GCM reaches the saturation current.

The constant current controller may include a second operator (e.g. OP AMP) AM2 including a first input electrode to which the target duty ratio signal TD is input, a second input electrode to which the second signal is applied, and an output electrode connected to the gain operator MU and outputting the gain NPCG to the gain operator MU.

For example, when the duty ratio represented by the target duty ratio signal TD is 30% and the measured duty ratio represented by the second signal is 35%, the second operator AM2 may output the gain NPCG of 6/7. In addition, when the duty ratio represented by the target duty ratio signal TD is 30% and the measured duty ratio represented by the second signal is 40%, the second operator AM2 may output the gain NPCG of 3/4.

When an output current of the power voltage generator 600 increases, the level of the second signal may increase and when the output current of the power voltage generator 600 decreases, the level of the second signal may decrease. As described above, the constant current controller may indirectly determine the level of the output current of the power voltage generator 600 based on the electrode signal which is supplied to the gate electrode of the switch T.

The constant current controller may perform the constant current control based on the level of the output current of the power voltage generator 600 which is indirectly determined based on the electrode signal which is applied to the gate electrode of the switch T. Accordingly, it is possible to omit the large capacitance sensing resistor for current sensing and an IC for converting the current caused by the voltage applied across the sensing resistor into a digital code.

The gain operator MU may generate the second switching signal SC by multiplying the gain NPCG to the first switching signal, and the second switching signal SC may be applied as the gate signal of the switch T to perform the constant current control of the power voltage generator 600.

Figure 4:
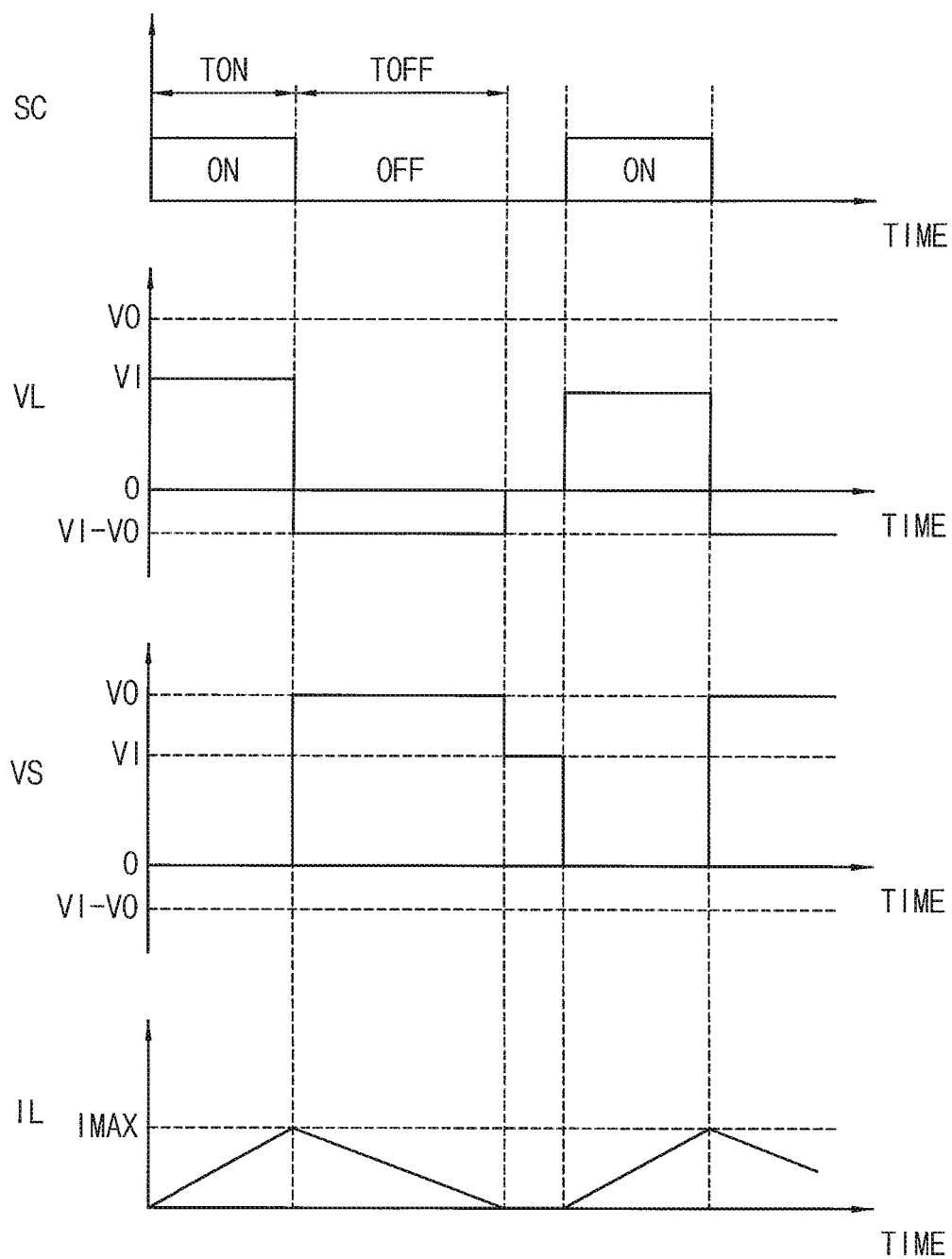
FIG. 4 is a timing diagram illustrating a signal in the power voltage generator of FIG. 2.
Figure 5A:
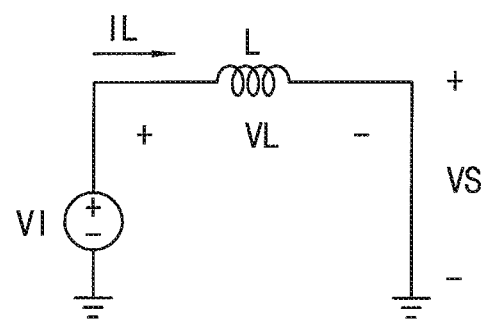
Figure 5B:
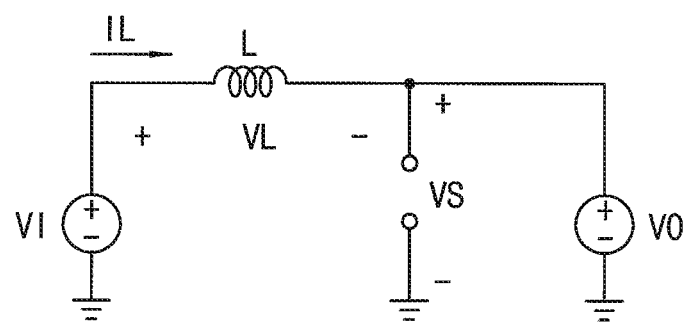
FIG. 5B is an equivalent circuit diagram of the booster shown in FIG. 2 when the switch of FIG. 2 is turned off.

FIG. 4 is a timing diagram illustrating a signal in the power voltage generator 600 of FIG. 2. FIG. 5A is an equivalent circuit diagram of the booster shown in FIG. 2 when the switch T of FIG. 2 is turned on. FIG. 5B is an equivalent circuit diagram of the booster shown in FIG. 2 when the switch T of FIG. 2 is turned off.

Referring to FIGS. 1 to 5B, when the switch T of the booster is turned on (TON duration) by the second switching signal SC as disclosed in FIG. 5A, the input voltage VI is charged in the inductor L so that the voltage VL of the inductor L is equal to the input voltage VI (VI=VL).

When the switch T of the booster is turned off (TOFF duration) by the second switching signal SC as disclosed in FIG. 5B, the output voltage VO is equal to the subtraction of a voltage VL of the inductor L from the input voltage VI (VO=VI-VL).

In FIG. 4, VS denotes a voltage applied across the switch T.

During the turn-on duration (TON duration) of the switch T, the current flowing through the inductor IL may gradually increase to IMAX, and during the turn-off duration (TOFF duration) of the switch T, the current flowing through the inductor IL may gradually decrease as disclosed in FIG. 4.

When the input voltage of the booster is VI, the output voltage of the booster is VO, an output current of the booster is IO, a measured duty ratio of the switch is D, an inductance of the inductor is L, and a time is t, the IO may be expressed as follows:

$$IO = \frac{VI^2 D^2 t}{2L(VO - VI)}$$

That is, the output current IO of the booster may be proportional to the square of the measurement duty ratio D of the switch T. Similarly, the magnitude of the second signal proportional to the output current IO of the booster may be proportional to the square of the measurement duty ratio of the switch. As described above, the constant current controller may indirectly determine the level of the output current IO of the booster by using the electrode signal applied to the gate electrode of the switch T without directly sensing the output current IO of the booster.

According to the present exemplary embodiment, the constant current control may be performed by sensing the signal of the gate electrode of the switch T of the booster, so that the large sensing resistor for current sensing and the IC that detects the current caused by the voltage applied across the large sensing resistor and converts the current into a digital code may be omitted. Therefore, the manufacturing cost of the display device may be reduced.

In addition, heat generation, voltage drop of the power voltage, and an increase of power consumption, which may occur when a large voltage is applied to the sensing resistor, may be prevented.

Figure 6:
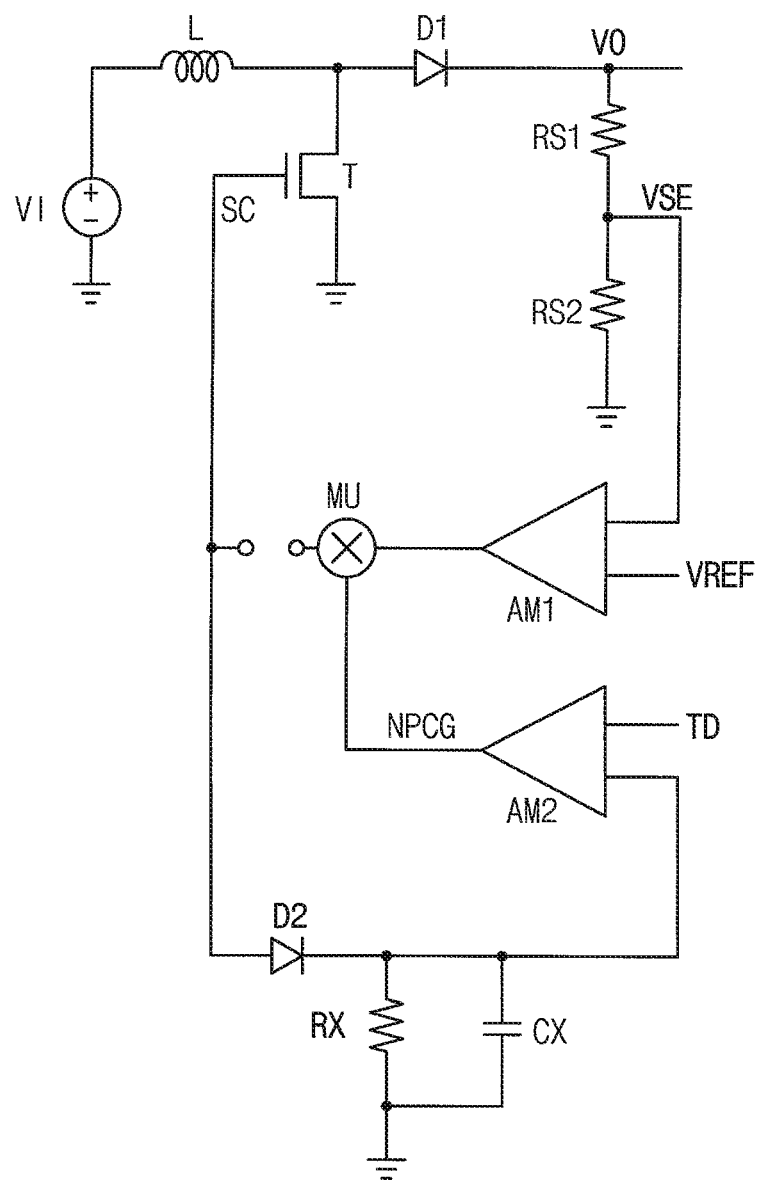
FIG. 6 is a circuit diagram illustrating a power voltage generator of a display device according to an exemplary embodiment of the present disclosure.

FIG. 6 is a circuit diagram illustrating the power voltage generator of the display device according to an exemplary embodiment of the present disclosure.

The power voltage generator and the display apparatus including the power voltage generator according to the present exemplary embodiment is substantially the same as the power voltage generator and the display apparatus including the power voltage generator of the previous exemplary embodiment explained referring to FIGS. 1 to 5B except for the structure of the power voltage generator. Thus, the same reference numerals will be used to refer to the same or like parts as those described in the previous exemplary embodiment of FIGS. 1 to 5B and any repetitive explanation concerning the above elements will be omitted.

Referring to FIGS. 1 and 3 to 6, the display device includes a display panel 100 and a display panel driver. The display panel driver includes a driving controller 200, a gate driver 300, a gamma reference voltage generator 400, a data driver 500 and a power voltage generator 600.

The power voltage generator 600 may include a booster, a voltage sensor, a constant voltage controller, and a constant current controller.

The booster may boost an input voltage VI to an output voltage VO based on the on-off operation of a switch T. The voltage sensor may generate a sensing voltage VSE by sensing the output voltage VO. The constant voltage controller may generate a first switching signal for controlling the switch T by comparing the sensing voltage VSE with a reference voltage VREF. The constant current controller may generate a gain NPCG based on a ratio of an electrode signal applied to the gate electrode of the switch T and a target signal by comparing the electrode signal applied to the gate electrode of the switch T with the target signal. In the present embodiment, the target signal may be a target duty ratio signal TD for generating a target current determined based on a load of input image data IMG of a display device. In the present embodiment, the electrode signal may be a signal applied to a gate electrode of the switch T.

The power voltage generator 600 may further include a gain operator MU configured to generate a second switching signal SC by multiplying the gain NPCG to the first switching signal. The on-off operation of the switch T may be controlled by the second switching signal SC.

The booster may include an inductor L, a first diode D1, and the switch T. The inductor L may include a first terminal to which the input voltage VI is applied and a second terminal connected to a first electrode of the first diode D1. The switch T may include a gate electrode, a source electrode, and a drain electrode, in which the second switching signal SC may be applied to the gate electrode, and the drain electrode may be connected to the first electrode of the first diode D1. The source electrode of the switch T may be connected to a ground. The first diode D1 may include the first electrode connected to the second terminal of the inductor L and a second electrode connected to the voltage generator and supplying the output voltage to the voltage generator.

The voltage sensor may include a first sensing resistor RS1 and a second sensing resistor RS2 which are connected in series. The first sensing resistor RS1 may include a first terminal connected to the second electrode of the first diode D1 to receive the output voltage from the booster and a second terminal connected to a first terminal of the second sensing resistor RS2. The second sensing resistor RS2 may include a first terminal connected to the second terminal of the first sensing resistor RS1 and a second terminal connected to the ground. The voltage sensor may sense the sensing voltage VSE corresponding to the output voltage VO by using the voltage divider rule between the first sensing resistor RS1 and the second sensing resistor RS2.

The constant voltage controller may include a first operator AM1 including a first input electrode to which the sensing voltage VSE is applied, a second input electrode to which the reference voltage VREF is applied, and an output electrode outputting the first switching signal.

In the present embodiment, the constant current controller may shut down the power voltage generator 600 when a difference between the target duty ratio signal TD and the second signal which is applied to the gate electrode of the switch T in the booster and is received through the signal smoothing circuit is greater than or equal to a threshold. For example, when the difference between the target duty ratio signal TD and the second signal is greater than or equal to the threshold, it may be determined that a short circuit occurs in the display panel 100 or a part of a voltage application line.

That is, the constant current controller of the present embodiment may perform the constant current control operation and the protection operation.

For example, when the difference between the target duty ratio signal TD and the second signal is greater than or equal to the threshold, the second operator AM2 may output the gain NPCG of zero (0).

According to the present exemplary embodiment, the constant current control may be operated by sensing the signal of the gate electrode of the switch T of the booster, so that the large sensing resistor for current sensing and the IC that detects the current caused by the voltage applied across the large sensing resistor and converts the current into a digital code may be omitted. Therefore, the manufacturing cost of the display device may be reduced.

In addition, heat generation, voltage drop of the power voltage, and an increase of power consumption, which may occur when a large voltage is applied to the sensing resistor, may be prevented.

Figure 7:
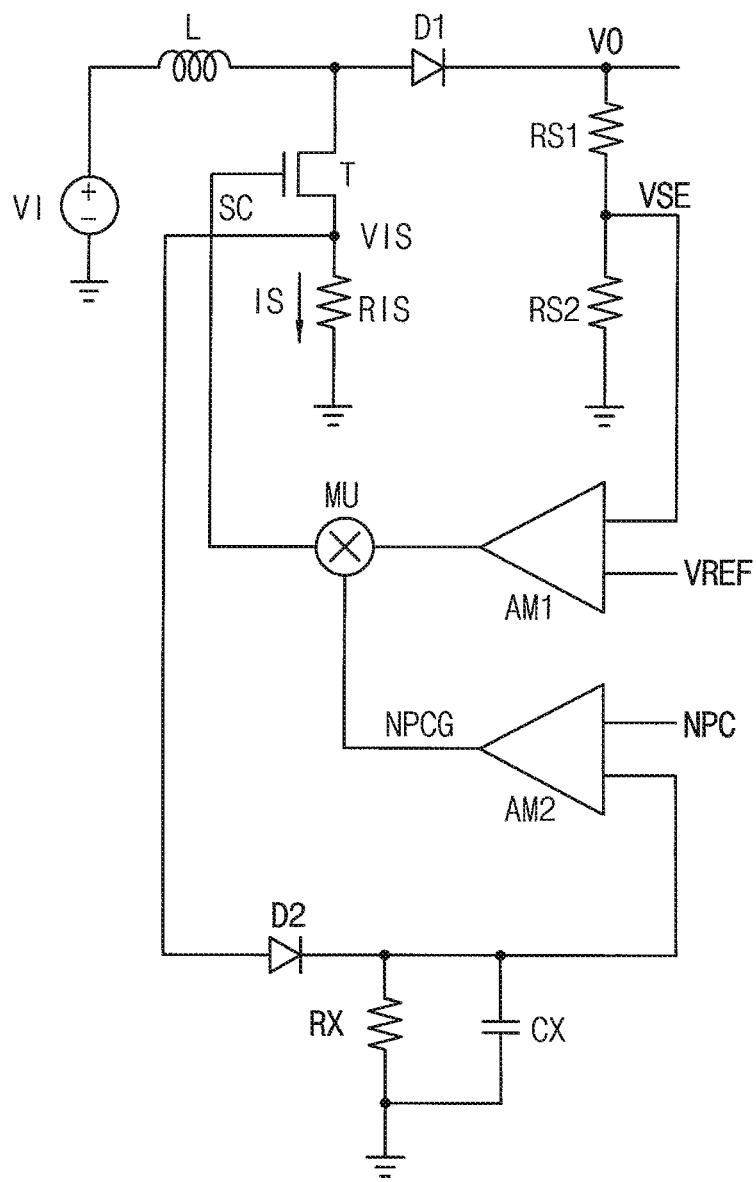
FIG. 7 is a circuit diagram illustrating a power voltage generator of a display device according to an exemplary embodiment of the present disclosure.

FIG. 7 is a circuit diagram illustrating the power voltage generator of the display device according to an exemplary embodiment of the present disclosure.

The power voltage generator and the display apparatus including the power voltage generator according to the present exemplary embodiment is substantially the same as the power voltage generator and the display apparatus including the power voltage generator of the previous exemplary embodiment explained referring to FIGS. 1 to 5B except for the structure of the power voltage generator. Thus, the same reference numerals will be used to refer to the same or like parts as those described in the previous exemplary embodiment of FIGS. 1 to 5B and any repetitive explanation concerning the above elements will be omitted.

Referring to FIGS. 1 and 3 to 5B and 7, the display device includes a display panel 100 and a display panel driver. The display panel driver includes a driving controller 200, a gate driver 300, a gamma reference voltage generator 400, a data driver 500 and a power voltage generator 600.

The power voltage generator 600 may include a booster, a voltage sensor, a constant voltage controller, and a constant current controller.

The booster may boost an input voltage VI to an output voltage VO based on the on-off operation of a switch T. The voltage sensor may generate a sensing voltage VSE by sensing the output voltage VO. The constant voltage controller may generate a first switching signal for controlling the switch T by comparing the sensing voltage VSE with a reference voltage VREF. The constant current controller may generate a gain NPCG based on a ratio of an electrode signal of the switch T and a target signal by comparing the electrode signal of the switch T with the target signal. In the present embodiment, the target signal may be a net power control signal NPC determined based on the load of the input image data IMG of the display device. In the present embodiment, the electrode signal may be a signal of the source electrode of the switch T. For example, the electrode signal may be a source current IS flowing through the source electrode of the switch T.

The power voltage generator 600 may further include a gain operator MU configured to generate a second switching signal SC by multiplying the gain NPCG to the first switching signal. The on-off operation of the switch T may be controlled by the second switching signal SC.

The booster may include an inductor L, a first diode D1, and the switch T. The inductor L may include a first terminal to which the input voltage VI is applied and a second terminal connected to a first electrode of the first diode D1. The switch T may include a gate electrode, a source electrode, and a drain electrode, in which the second switching signal SC may be applied to the gate electrode, and the drain electrode may be connected to the first electrode of the first diode D1. The first diode D1 may include the first electrode connected to the second terminal of the inductor L and a second electrode connected to the voltage sensor and supplying the output voltage to the voltage sensor.

The voltage sensor may include a first sensing resistor RS1 and a second sensing resistor RS2 which are connected in series. The first sensing resistor RS1 may include a first terminal connected to the second electrode of the first diode D1 to receive the output voltage from the booster and a second terminal connected to a first terminal of the second sensing resistor RS2. The second sensing resistor RS2 may include a first terminal connected to the second terminal of the first sensing resistor RS1 and a second terminal connected to the ground. The voltage sensor may sense the sensing voltage VSE corresponding to the output voltage VO by using the voltage divider rule between the first sensing resistor RS1 and the second sensing resistor RS2.

The constant voltage controller may include a first operator AM1 including a first input electrode to which the sensing voltage VSE is applied, a second input electrode to which the reference voltage VREF is applied, and an output electrode outputting the first switching signal.

The booster may further include a current sensing resistor RIS disposed between the source electrode of the switch T and the ground. The current sensing voltage VIS of the first terminal of the current sensing resistor RIS may be output to the constant power controller through the signal smoothing circuit.

The signal of the source electrode of the switch may be a first signal. The first signal may be a triangular wave signal. The power voltage generator 600 may further include a signal smoothing circuit configured to convert the first signal, which is the triangle wave signal, into a second signal, which is a DC signal.

The signal smoothing circuit may include a second diode D2, a resistor RX, and a capacitor CX.

The constant current controller may generate the gain NPCG by comparing the second signal with the net power control signal NPC determined based on the load of the input image data IMG of the display device. The net power control signal NPC may increase proportional to the load of the input image data IMG, and maintain the saturation level after it reaches the saturation level.

The constant current controller may include a second operator AM2 including a first input electrode to which the net power control signal NPC is input, a second input electrode to which the second signal is applied, and an output electrode to output the gain NPCG to the gain operator MU.

The gain operator MU may generate the second switching signal SC by multiplying the gain NPCG to the first switching signal, and the second switching signal SC may be applied as the gate signal of the switch T to perform the constant current control of the power voltage generator 600.

According to the present exemplary embodiment, the constant current control may be performed by sensing the signal of the source electrode of the switch T in the booster, so that the large sensing resistor for current sensing and the IC that detects the current caused by the voltage applied across the large sensing resistor and converts the current into a digital code may be omitted. Therefore, the manufacturing cost of the display device may be reduced.

In addition, heat generation, voltage drop of the power voltage, and an increase of power consumption, which may occur when a large voltage is applied to the sensing resistor, may be prevented.

Figure 8:
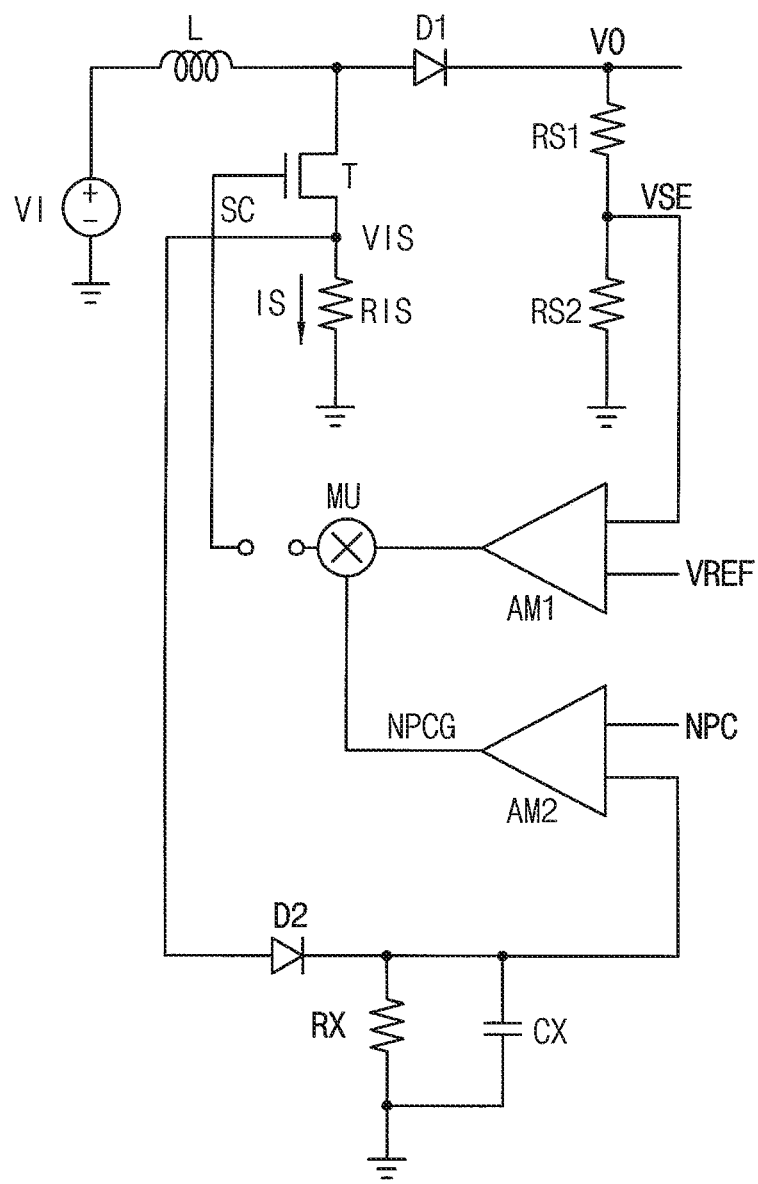
FIG. 8 is a circuit diagram illustrating a power voltage generator of a display device according to an exemplary embodiment of the present disclosure.

FIG. 8 is a circuit diagram illustrating the power voltage generator of the display device according to an exemplary embodiment of the present disclosure.

The power voltage generator and the display apparatus including the power voltage generator according to the present exemplary embodiment is substantially the same as the power voltage generator and the display apparatus including the power voltage generator of the previous exemplary embodiment explained referring to FIG. 7 except for the structure of the power voltage generator. Thus, the same reference numerals will be used to refer to the same or like parts as those described in the previous exemplary embodiment of FIG. 7 and any repetitive explanation concerning the above elements will be omitted.

Referring to FIGS. 1 and 3 to 5B and 8, the display device includes a display panel 100 and a display panel driver. The display panel driver includes a driving controller 200, a gate driver 300, a gamma reference voltage generator 400, a data driver 500 and a power voltage generator 600.

The power voltage generator 600 may include a booster, a voltage sensor, a constant voltage controller, and a constant current controller.

The booster may boost an input voltage VI to an output voltage VO based on the on-off operation of a switch T. The voltage sensor may generate a sensing voltage VSE by sensing the output voltage VO. The constant voltage controller may generate a first switching signal for controlling the switch T by comparing the sensing voltage VSE with a reference voltage VREF. The constant current controller may generate a gain NPCG based on a ratio of an electrode signal of the switch T and a target signal by comparing the electrode signal of the switch T with the target signal. In the present embodiment, the target signal may be a net power control signal NPC determined based on the load of the input image data IMG of the display device. In the present embodiment, the electrode signal may be a signal of the source electrode of the switch T.

The power voltage generator 600 may further include a gain operator MU configured to generate a second switching signal SC by multiplying the gain NPCG to the first switching signal. The on-off operation of the switch T may be controlled by the second switching signal SC.

The booster may include an inductor L, a first diode D1, and the switch T. The inductor L may include a first terminal to which the input voltage VI is applied and a second terminal connected to a first electrode of the first diode D1. The switch T may include a gate electrode, a source electrode, and a drain electrode, in which the second switching signal SC may be applied to the gate electrode, and the drain electrode may be connected to the first electrode of the first diode D1. The first diode D1 may include the first electrode connected to the second terminal of the inductor L and a second electrode connected to the voltage sensor and outputting the output voltage to the voltage sensor.

The voltage sensor may include a first sensing resistor RS1 and a second sensing resistor RS2 which are connected in series. The first sensing resistor RS1 may include a first terminal connected to the second electrode of the first diode D1 to receive the output voltage from the booster and a second terminal connected to a first terminal of the second sensing resistor RS2. The second sensing resistor RS2 may include a first terminal connected to the second terminal of the first sensing resistor RS1 and a second terminal connected to the ground. The voltage sensor may sense the sensing voltage VSE corresponding to the output voltage VO by using the voltage divider rule between the first sensing resistor RS1 and the second sensing resistor RS2.

The constant voltage controller may include a first operator AM1 including a first input electrode to which the sensing voltage VSE is applied, a second input electrode to which the reference voltage VREF is applied, and an output electrode outputting the first switching signal to the gain operator MU.

In the present embodiment, the constant current controller may shut down the power voltage generator 600 when a difference between the net power control signal NPC and the second signal applied to a gate electrode of the switch T of the booster and received through the signal smoothing circuit is greater than or equal to a threshold. For example, when the difference between the net power control signal NPC and the second signal is greater than or equal to the threshold, it may be determined that a short circuit occurs in the display panel 100 or a part of the voltage application line.

That is, the constant current controller of the present embodiment may perform the constant current control operation and the protection operation.

For example, when the difference between the net power control signal NPC and the second signal is greater than or equal to the threshold, the second operator AM2 may output the gain NPCG of zero (0).

According to the present exemplary embodiment, the constant current control may be performed by sensing the signal of the gate electrode or the signal of the source electrode of the switch T of the booster, so that the large sensing resistor for current sensing and the IC that detects the current caused by the voltage applied across the large sensing resistor and converts the current into a digital code may be omitted. Therefore, the manufacturing cost of the display device may be reduced.

In addition, heat generation, voltage drop of the power voltage, and an increase of power consumption, which may occur when a large voltage is applied to the sensing resistor, may be prevented.

According to the present inventive concept as explained above, the manufacturing cost of the display apparatus and the power consumption of the display apparatus may be reduced. The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A power voltage generator comprising:
  a booster configured to boost an input voltage to an output voltage based on an on-off operation of a switch;
  a voltage sensor configured to generate a sensing voltage by sensing the output voltage;
  a constant voltage controller configured to generate a first switching signal to control the switch by comparing the sensing voltage with a reference voltage;
  a constant current controller configured to generate a gain based on a ratio of an electrode signal of the switch and a target signal by comparing the electrode signal of the switch with the target signal; and
  a gain operator connected to the constant voltage controller to receive an output from the constant voltage controller and the constant current controller to receive the gain from the constant current controller, and configured to generate a second switching signal by multiplying the gain to the first switching signal.

2. The power voltage generator of claim 1,
  wherein the on-off operation of the switch is controlled by the second switching signal.

3. The power voltage generator of claim 2, wherein the booster includes an inductor, a first diode, and the switch,
  the inductor includes a first terminal to which the input voltage is applied and a second terminal connected to a first electrode of the first diode,
  the switch includes a gate electrode, a source electrode and a drain electrode, the second switching signal being applied to the gate electrode, and the drain electrode being connected to the first electrode of the first diode, and the first diode includes the first electrode connected to the second terminal of the inductor and a second electrode connected to the voltage sensor and outputting the output voltage to the voltage sensor.

4. The power voltage generator of claim 3, wherein the electrode signal of the switch is a first signal which is a signal of the gate electrode of the switch.

5. The power voltage generator of claim 4, wherein the first signal is a pulse width modulation signal, and
the power voltage generator further comprises a signal smoothing circuit configured to convert the first signal, which is the pulse width modulation signal, into a second signal, which is a direct current signal.

6. The power voltage generator of claim 5, wherein the signal smoothing circuit includes a second diode, a resistor, and a capacitor,
the second diode includes a first electrode to which the first signal is applied and a second electrode connected to a first terminal of the resistor,
the resistor includes a first terminal connected to the second electrode of the second diode and a second terminal connected to a ground, and
the capacitor includes a first electrode connected to the second electrode of the second diode and a second electrode connected to the ground.

7. The power voltage generator of claim 4, wherein the constant current controller is configured to generate the gain by comparing the second signal with a target duty ratio signal for generating a target current determined based on a load of input image data of a display device, and
the target current increases as the load of the input image data increases and maintains a saturation current after the target current reaches the saturation current.

8. The power voltage generator of claim 7, wherein the constant current controller includes a second operator including a first input electrode to which the target duty ratio signal is input, a second input electrode to which the second signal is applied, and an output electrode connected to the gain operator and outputting the gain to the gain operator.

9. The power voltage generator of claim 8, wherein the constant current controller is configured to shut down the power voltage generator when a difference between the target duty ratio signal and the second signal is greater than or equal to a threshold.

10. The power voltage generator of claim 9, wherein the second operator is configured to output the gain of zero (0) when the difference between the target duty ratio signal and the second signal is greater than or equal to the threshold.

11. The power voltage generator of claim 7, wherein, when the input voltage of the booster is VI, the output voltage of the booster is VO, an output current of the booster is IO, a measured duty ratio of the switch is D, an inductance of the inductor is L, and a time is t, the IO is represented as follows:

$$IO = \frac{VI^2 D^2 t}{2L(VO - VI)}.$$

12. The power voltage generator of claim 3, wherein the electrode signal of the switch is a first signal which is a signal of the source electrode of the switch.

13. The power voltage generator of claim 12, wherein the first signal is a triangular wave signal, and
the power voltage generator further comprises a signal smoothing circuit configured to convert the first signal, which is the triangle wave signal, into a second signal, which is a direct current signal.

14. The power voltage generator of claim 13, wherein the signal smoothing circuit includes a second diode, a resistor, and a capacitor,
the second diode includes a first electrode to which the first signal is applied and a second electrode connected to a first terminal of the resistor,
the resistor includes the first terminal connected to the second electrode of the second diode and a second terminal connected to a ground, and
the capacitor includes a first electrode connected to the second electrode of the second diode and a second electrode connected to a ground.

15. The power voltage generator of claim 12, wherein the constant current controller is configured to generate the gain by comparing the second signal with a net power control signal determined by a load of an input image data of a display device, and
the net power control signal increases as the load of the input image data increases and maintains a saturation level after the net power control signal reaches the saturation level.

16. The power voltage generator of claim 15, wherein the constant current controller includes a second operator including a first input electrode to which the net power control signal is input, a second input electrode to which the second signal is applied, and an output electrode connected to the gain operator and outputting the gain to the gain operator.

17. The power voltage generator of claim 16, wherein the constant current controller is configured to shut down the power voltage generator when a difference between the net power control signal and the second signal is greater than or equal to a threshold.

18. The power voltage generator of claim 17, wherein the second operator outputs the gain of zero (0) when the difference between the net power control signal and the second signal is greater than or equal to the threshold.

19. The power voltage generator of claim 3, wherein the voltage sensor includes a first sensing resistor and a second sensing resistor,
the first sensing resistor includes a first terminal connected to the second electrode of the first diode and a second terminal connected to a first terminal of the second sensing resistor, and
the second sensing resistor includes a first terminal connected to the second terminal of the first sensing resistor and a second terminal connected to a ground.

20. The power voltage generator of claim 3, wherein the constant voltage controller includes a first operator including a first input electrode to which the sensing voltage is applied, a second input electrode to which the reference voltage is applied, and an output electrode connected to the gain operator and outputting the first switching signal to the gain operator.

21. A display device comprising:
a display panel including a gate line, a data line, and a pixel connected to the gate line and the data line and configured to display an image based on input image data;
a gate driver configured to output a gate signal to the gate line;
a data driver configured to output a data voltage to the data line; and
a power voltage generator configured to apply a power voltage to the pixel, wherein the power voltage generator comprises:
a booster configured to boost an input voltage to an output voltage based on an on-off operation of a switch,
a voltage sensor configured to generate a sensing voltage by sensing the output voltage;
a constant voltage controller configured to generate a first switching signal to control the switch by comparing the sensing voltage with a reference voltage,
a constant current controller connected to the switch to receive an electrode signal from the switch and configured to generate a gain based on a ratio of the electrode signal of the switch and a target signal by comparing the electrode signal of the switch with the target signal, and
a gain operator connected to the constant voltage controller to receive an output from the constant voltage controller and the constant current controller to receive the gain from the constant current controller, and configured to generate a second switching signal by multiplying the gain to the first switching signal, and
wherein the output voltage is the power voltage.

22. The display device of claim 21,
wherein the on-off operation of the switch is controlled by the second switching signal.

23. A power voltage generator comprising:
a booster connected between an input voltage node and an output voltage node, the booster including a switch which includes a source electrode connected to a ground and a gate electrode:
a voltage sensor connected to an output node and outputting a sensing voltage;
a first OP AMP which includes a first input electrode receiving the sensing voltage and a second input electrode receiving a reference voltage to output a first switching signal;
a second OP AMP which includes a first input electrode receiving a target duty ratio signal and a second input electrode connected to the switch; and
a gain operator connected between the switch and the first OP AMP, and the switch and the second OP AMP, the gain operator receiving the first switching signal from the first OP AMP and a gain from the second OP AMP.

24. The power voltage generator of claim 23, further comprising a signal smoothing circuit connected between the second input electrode of the second OP AMP and the switch.

25. The power voltage generator of claim 24, wherein the second input electrode of the second OP AMP is connected to the gate electrode of the switch via a diode in the signal smoothing circuit.

26. The power voltage generator of claim 24, wherein the second input electrode of the second OP AMP is connected to the source electrode of the switch via a diode in the signal smoothing circuit.

* * * * *